(12) United States Patent
Ono et al.

(10) Patent No.: US 8,501,608 B2
(45) Date of Patent: Aug. 6, 2013

(54) METHOD FOR PROCESSING SEMICONDUCTOR DEVICE

(75) Inventors: Tetsuo Ono, Tsukuba (JP); Tetsu Morooka, Tsukuba (JP)

(73) Assignee: Hitachi High-Technologies Corporation, Tokyo (JP)

( * ) Notice: Subject to any disclaimer, the term of this patent is extended or adjusted under 35 U.S.C. 154(b) by 12 days.

(21) Appl. No.: 12/694,394

(22) Filed: Jan. 27, 2010

(65) Prior Publication Data

US 2011/0104882 A1 May 5, 2011

(30) Foreign Application Priority Data

Nov. 5, 2009 (JP) .................. 2009-253910

(51) Int. Cl.
*H01L 21/3205* (2006.01)
*H01L 21/4763* (2006.01)

(52) U.S. Cl.
USPC .... 438/591; 438/714; 438/720; 257/E21.177; 257/E21.206

(58) Field of Classification Search
USPC .................. 438/591, 704; 257/411, E21.177, 257/E21.214, E21.251
See application file for complete search history.

(56) References Cited

U.S. PATENT DOCUMENTS

| 6,245,684 | B1 * | 6/2001 | Zhao et al. ..................... 438/704 |
| 6,723,652 | B1 | 4/2004 | Fukuda | |
| 6,800,326 | B1 * | 10/2004 | Uchiyama ..................... 427/309 |
| 2005/0081781 | A1 * | 4/2005 | Lin et al. ........................ 117/104 |
| 2005/0260804 | A1 * | 11/2005 | Kang et al. .................... 438/164 |
| 2008/0224238 | A1 * | 9/2008 | Kanakasabapathy et al. ............................ 257/411 |

FOREIGN PATENT DOCUMENTS

| JP | 2005-044890 | 2/2005 |
| KR | 10-0747671 | 8/2007 |
| KR | 2008/0018711 | 2/2008 |

* cited by examiner

*Primary Examiner* — Charles Garber
*Assistant Examiner* — Abdulfattah Mustapha
(74) *Attorney, Agent, or Firm* — Antonelli, Terry, Stout & Kraus, LLP.

(57) ABSTRACT

The present invention relates to a method for processing semiconductor devices with a fine structure, and more particularly, to a processing method suitable for miniaturizing semiconductor devices with a so-called high-k/metal gate structure. In an embodiment of the present invention, a deposited film, which includes an insulating film made of Hf or Zr and a material of Mg, Y or Al existing on, under or in the insulating film, is formed on a Si substrate and is removed by repeating a dry etching process and a wet etching process at least one time. The wet etching process is performed prior to the dry etching process.

9 Claims, 7 Drawing Sheets

VACUUM EVACUATION

US 8,501,608 B2

METHOD FOR PROCESSING SEMICONDUCTOR DEVICE

CLAIM OF PRIORITY

The present application claims priority from Japanese Patent Application JP 2009-253910 filed on Nov. 5, 2009, the content of which is hereby incorporated by reference into this application.

FIELD OF THE INVENTION

The present invention relates to a method for processing semiconductor devices, and more particularly, to a method for processing transistors with a fine structure or a so-called high-k/metal gate structure with high accuracy.

BACKGROUND OF THE INVENTION

Japanese Patent Application laid-Open Publication No. 2005-44890 discloses a method for etching high-k dielectric films. The high-k dielectric films are used as gate insulating films of transistors and are expected to decrease current leakage to suppress more power consumption in comparison with conventionally used $SiO_2$ films. However, processing techniques for fabricating the transistors, including removal of the high-k dielectric films, have not been fully established, and various methods are still in the research-and-development stage. As disclosed in Japanese Patent Application Laid-Open Publication No. 2005-44890, a high-k dielectric film containing Hf is dry-etched with a gas of $BCl_3$, HBr, $O_2$, fluorocarbon or the like, while a high-k dielectric film including La, Al or the like is wet-etched with a solution containing fluorinated acid and amine.

SUMMARY OF THE INVENTION

The present invention focuses on a highly-accurate process for semiconductor devices adopting what it called high-k/metal gate technology that has been proposed to enhance the speed of transistors.

A known process for such a metal gate structure includes: depositing a metal electrode made of TiN or TaN on a high-k dielectric film, serving as a gate insulating film, made of hafnium oxide (HfO) or zirconium oxide (ZrO); further depositing a conducting material, such as poly Si, W and Mo, to form a deposition structure; and etching the deposition structure with a resist as a mask.

The currently required processing size (line width) is 65 nm or less. In addition, in the case of CMOS transistors, the threshold voltages of p-type and n-type transistors need to be equal. The threshold voltages depend on the work function of the material making up a gate interface.

In order to control the work function, Mg, Al or Y may be mixed into a high-k dielectric film containing HfO or ZrO, or a film of Mg, Al or Y or a film of an oxide of Mg, Al or Y may be formed on or under the HfO or ZrO film. However, in the related art, there is so far no disclosure about efficient removal methods of the HfO or ZrO high-k dielectric film mixed with the other metal or the multi-layered film of the high-k dielectric film and the other metal film.

The present invention provides a method for efficiently removing a film made of a HfO or ZrO high-k dielectric film mixed with Mg, Al or Y, or a multi-layered film of the HfO or ZrO high-k dielectric film and a film of Mg, Al or Y (hereinafter, simply referred to as "deposited film").

One of representative examples of the present invention is shown below. The present invention relates to a method for processing a semiconductor device with a metal gate structure in which a metal electrode is placed on a deposited film formed on a Si substrate, the deposited film including a high-k dielectric film and a material for controlling a work function. The method is characterized in performing at least one wet etching process and at least one dry etching process to remove the deposited film including the high-k dielectric film and the material for controlling the work function. The wet etching process is performed prior to the dry etching process.

According to the present invention, the use of the dry etching process subsequent to the wet etching process to remove the high-k dielectric film reduces time required to remove the deposited film, resulting in improvement of throughput. In addition, the number and time of the dry etching can be decreased, thereby reducing wafer damage.

DETAILED DESCRIPTION OF THE PREFERRED EMBODIMENTS

Embodiments of the present invention will be described in detail referring to the figures.

First Embodiment

With reference to FIG. 1 to FIG. 5C, a method for processing a semiconductor device according to a first embodiment of the present invention will be described.

Figure 1:
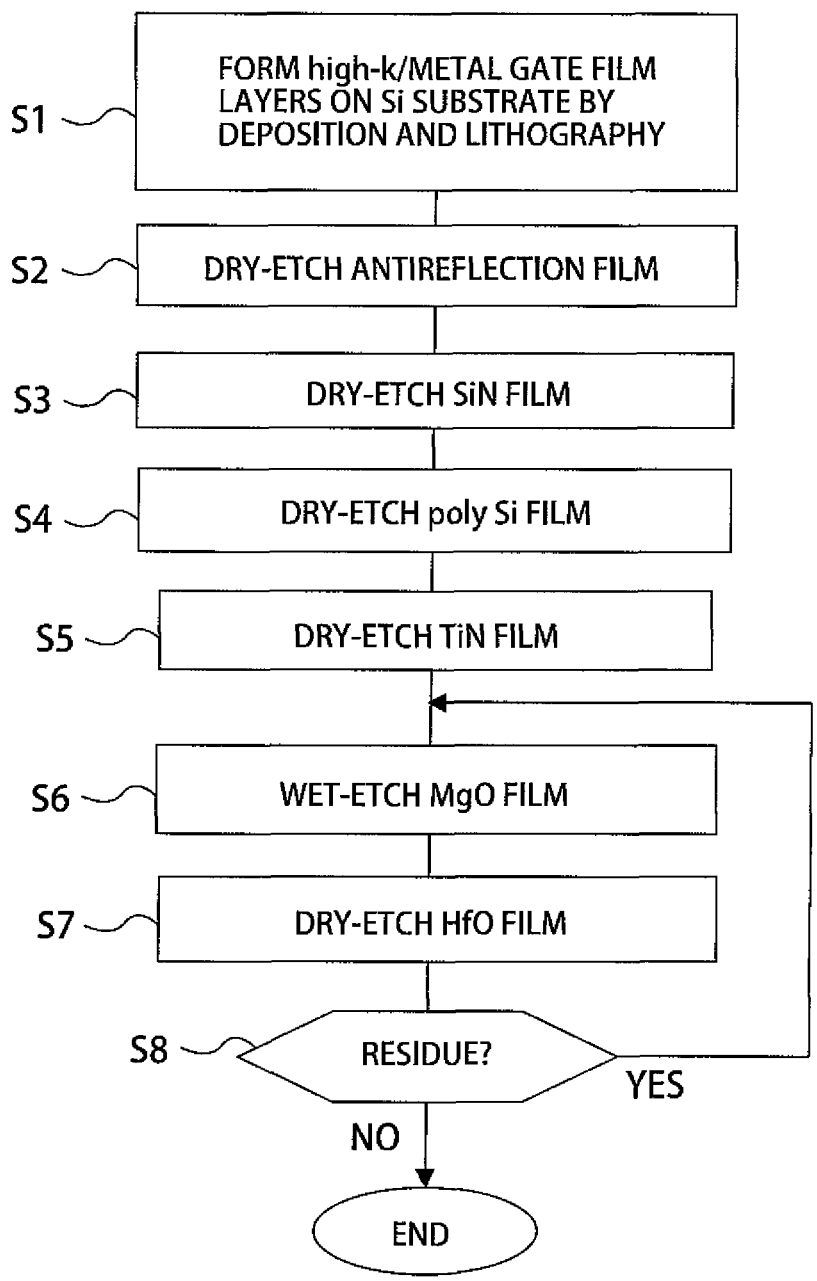
FIG. 1 is a flow chart describing a method for processing a semiconductor device according to a first embodiment of the present invention.

FIG. 1 is a flow chart describing the method. FIGS. 2A to 2D are cross-sectional views showing a multi-layered film having a high-k/metal gate structure fabricated according to the flow chart in FIG. 1. In FIG. 1, in advance, a HfO film 202 as a high-k dielectric film, a MgO film 203 used to control the work function, a TiN film 204 as a metal gate, a poly Si film 205 as an electrode material and a SiN film 206 as a cap are subsequently deposited on a Si substrate 201. Then, an anti-reflection film 207 and a resist film 208 are applied on the SiN film 206 to form a required pattern by lithography, thereby preparing the multi-layered film (step S1 in FIG. 1). It should be noted that the formation of the multi-layered film is not limited to this example.

Figure 2A:
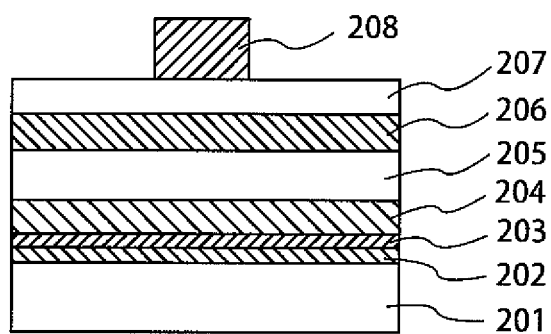
FIGS. 2A to 2D are cross-sectional views of a multi-layered film having a high-k/metal gate structure, the views corresponding to the processes of the first embodiment, respectively.

A cross-sectional view of the multi-layered film having the high-k/metal gate structure formed in step S1 is shown in FIG. 2A. As an example, the thickness of each film in the multi-layered film is: 2 nm for the HfO film 202; 1 nm for the MgO film 203; 10 nm for the TiN film 204; 50 nm for the poly Si film 205; 50 nm for the SiN film 206; 80 nm for the antireflection film 207; and 150 nm for the resist film 208.

Next, the multi-layered film is subjected to a dry etching process and a wet etching process to remove undesired parts thereof to complete the high-k/metal gate structure.

Figure 3:
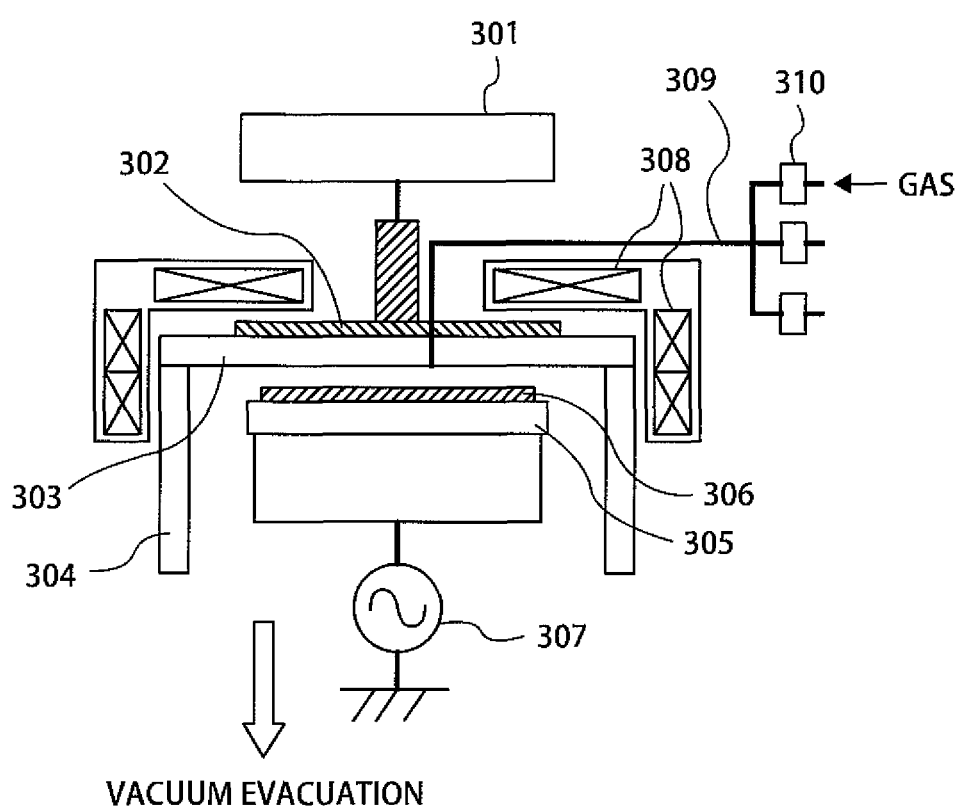
FIG. 3 is a vertical cross-sectional view showing an example of a dry etching apparatus used to perform the embodiment of the present invention.

An exemplary dry etching apparatus and wet etching apparatus required to embody the present invention will be described with FIGS. 3 and 4. The dry etching apparatus shown as an example in FIG. 3 adopts an electron cyclotron resonance (ESR) technique. In the dry etching apparatus, electromagnetic waves are emitted from a plasma power source 301 and discharged through an antenna 302 and a window 303, which is made of quartz allowing the electromagnetic waves to pass therethrough, into a vacuum chamber 304. The vacuum chamber 304 is evacuated using a vacuum pump, while a predetermined etching gas is introduced through a gas inlet pipe 309 and gas flow controllers 310 into the chamber whose pressure is maintained constant. A sample stage 305, which holds a wafer 306, is connected to a bias power source 307 that accelerates incident ions. With the electromagnetic waves emitted from the antenna 302, the etching gas is converted into plasma, and reactive ions strike the wafer 306 to etch the wafer 306. In this apparatus, electromagnetic coils 308 create a magnetic field in the chamber 304. The magnetic field strength is set so as to match the frequency of the electron cyclotron resonance in plasma and the frequency of the plasma power source 301, thereby allowing the plasma to efficiently absorb the power and therefore maintaining a high plasma density at a low pressure. The magnetic field strength required to create the ESR can be set by varying the current value to be fed to the electromagnetic coils 308.

Figure 4:
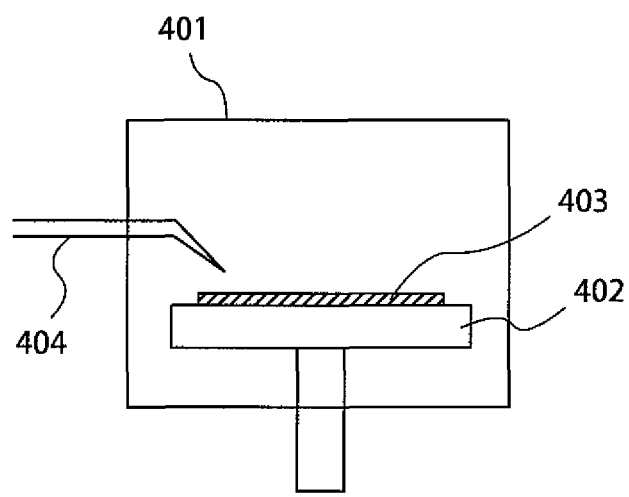
FIG. 4 is a vertical cross-sectional view showing an example of a wet etching apparatus used to perform the embodiment of the present invention.

FIG. 4 shows an example of a single-wafer wet etching apparatus. In the apparatus, a wafer 403 is placed on a sample stage 402 in a container 401 maintained at atmospheric pressure and an etching solution is supplied through an etchant feeding nozzle 404 onto a surface of the wafer, thereby wet-etching the wafer 403.

Returning to the flow chart in FIG. 1, descriptions will be made in detail about the method for processing a semiconductor device according to the first embodiment of the present invention. As described above, FIG. 2A shows a multi-layered film to which processes according to the embodiment of the present invention have not been yet applied, in short, a multi-layered film in an initial state. Etching processes are applied to the multi-layered film in such a state. As an example, the antireflection film 207 is etched by $Ar/HBr/O_2$ gas (S2), and the SiN film 206 is etched by $CF_4/CHF_3/O_2$ gas (S3). Furthermore, the Poly Si film 205 is etched by $Ar/CF_4/CHF_3/SF_6$ gas during a breakthrough etch, by $Ar/Cl_2/HBr/O_2$ gas during a main etch and by HBr gas during an over etch (S4). The TiN film is etched by $CF_4$ gas during a breakthrough etch and by $Cl_2$ gas during a main etch (S5).

Figure 2B:
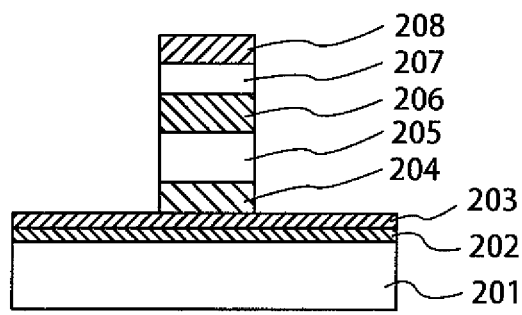
Figure 2C:
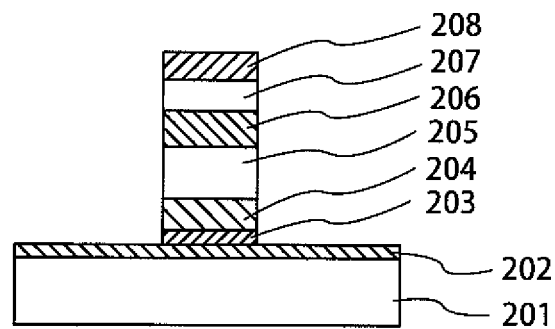
Figure 2D:
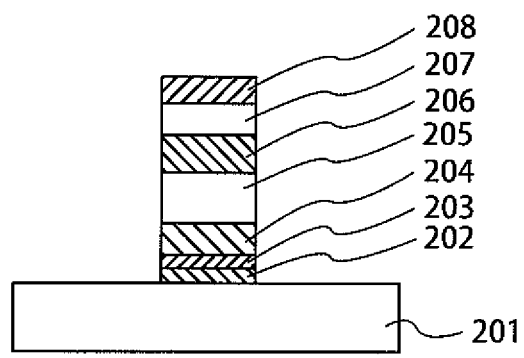

FIG. 2B is a cross-sectional view of the multi-layered film that has been etched to the depth of the TiN film 204 through the dry etching processes. Next step is to remove the deposited film including the high-k dielectric film and MgO film 203 for controlling the work function. In the usual manner, the high-k dielectric film is subjected to dry etching; however, in accordance with this embodiment of the present invention, the MgO film 203 is first wet-etched in HF solution (S6) to bring the multi-layered film into the state shown in FIG. 2C. The wet etch process is performed with 0.25% HF solution for 120 seconds, for example. Subsequently, the HfO film 202 is dry-etched by $BCl_3/Cl_2$ gas (S7). Then, an inspection apparatus (not shown) checks whether there is a residue of the deposited film or the other films on the processed surface of the wafer (semiconductor device) (S8). The presence of a residue is determined by, for example, finding even one residue in a field of view of a scanning electron microscope or substantially detecting a residue on the processed surface. In the case where it is determined there is a residue, the multi-layered film goes back to the wet etching process (S6) to remove the residue with the HF solution and is subjected to dry etching again (S7). Steps S6 to S8 are repeatedly performed to the deposited film until the residue disappears, thereby obtaining the semiconductor device in the state shown in FIG. 2D.

The feature of the first embodiment is that the wet etching process is always performed prior to the dry etching process used to remove the deposited film including the high-k dielectric film and MgO film for controlling the work function from the multi-layered film. Since the deposited film shown in FIGS. 2A to 2D includes the MgO film 203 placed on the HfO film 202, the procedure in which the dry etch of the HrO film 202 is performed after the wet etch of the MgO film 203 is the natural course. However, even though the deposited film contains HfO and Mg mixed thereto or includes a HfO film and a MgO film placed under the HfO film, the wet etching process with the HF solution is performed in advance in the first embodiment.

This procedure reduces wafer damage caused by the dry etching process as well as removes the high-k dielectric film by dry etching with a small amount of residue left on the wafer.

Figure 5A:
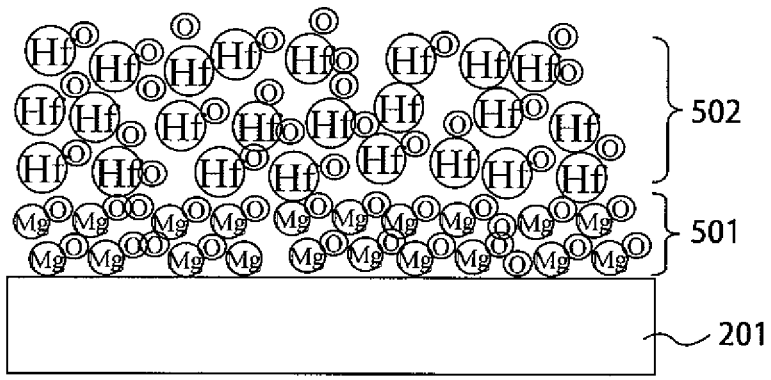
FIGS. 5A to 5C are schematic diagrams showing the high-k dielectric film at an atomic level to explain the action and effect of the embodiment of the present invention.
Figure 5B:
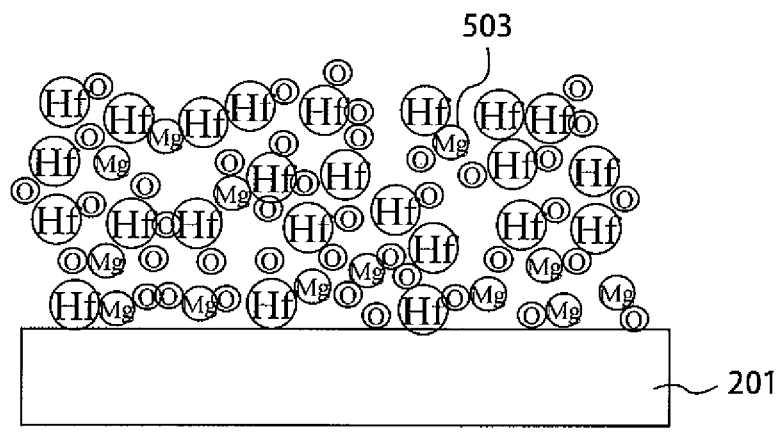
Figure 5C:
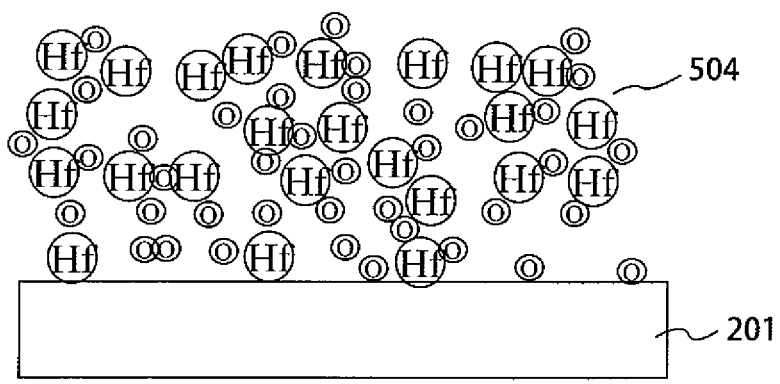

The action and effect produced by the method according to the first embodiment of the present invention will be described below with reference to FIGS. 5A to 5C. The method was found experimentally and there is explicit evidence. Since some points need to be clarified; however, the description accompanied by FIGS. 5A to 5C will be about a mechanism assumed by the inventors. FIGS. 5A to 5C are diagrams of the interface between the HfO film and MgO film, which are magnified to an atomic level. This deposited film is made by depositing a MgO film 501 and a HfO film 502, in this order, on a Si substrate 201. Unlike the exemplary multi-layered film shown in FIGS. 2A to 2D, the MgO film 501 is deposited under the HfO film 502.

Immediately after formation of the deposited film, Mg atoms and Hf atoms are separated from each other, like they are in different layers, as shown in FIG. 5A. In general, the high-k dielectric film is subjected to heat treatment after the HfO film and MgO film are deposited in step S1 in FIG. 1 for the purpose of stabilizing the interface, and the TiN film is deposited thereon. As is apparent from FIG. 5B showing the state of the heat-treated deposited film, the Mg atoms 503 and Hf atoms are mixed to a degree due to the interdiffusion. It is conceivable that the deposited film in this state, i.e., the film of the HfO atoms mixed with a certain amount of the Mg atoms 503 may suffer delays in the progress of the etching process using $BCl_3/Cl_2$ gas. On the other hand, in a wet etching process using the HF solution, F ions penetrate into the deposited film while cleaving the bonds of atoms whose charges are greatly unbalanced, in short, MgO bonds, and eliminate the Mg atoms as shown in FIG. 5C. The atom density of the remaining HfO film 504 becomes low because of elimination of the Mg atoms, thereby realizing easy removal of the HfO film 504 by the dry etching process using the $BCl_3/Cl_2$ gas.

According to the experiments by the inventors and others, in order to remove a deposited film including a HfO film of 2 nm, but not MgO film, through a dry etching process, the deposited film needs to be dry-etched with a mixed gas of $BCl_3$ of 80 ml/min and $Cl_2$ of 20 ml/min, in a plasma at a pressure of 0.2 Pa, for 20 seconds with the wafer applied with a bias power of 10 W and subsequently for 60 seconds at a bias power of 0 W. In the case where a deposited film including a HfO film of 2 nm and a MgO film is first wet-etched in HF solution to remove Mg atoms based on the method of the first embodiment of the present invention, the HfO film can be removed by dry etching it for 60 seconds at a bias power of 0 W. It is apparent that removal of the Mg atoms enhances the dry etching of the HfO film.

It is also possible to remove the high-k dielectric film, as in the case of conventional technique, by adding a dry etching process using $BCl_3/Cl_2$ gas before performing the HF wet etching process to the deposited film and then performing a HF wet etching process and dry etching process with the $BCl_3/Cl_2$ gas again; however, this extends process time as well as decreases throughput. As a result, the substrate may suffer more damage due to an increase in the number of the dry etching process by one time.

Although the etching method of the first embodiment is used for a deposited film having the MgO film under the HfO film, quite the same method can be used for a deposited film having the MgO film on the HfO film or a deposited film having the HfO film mixed with the Mg atoms in advance.

In other words, the method according to the first embodiment in which a dry etching process with the $BCl_3/Cl_2$ gas is performed after a wet etching process with the HF solution produces the above-described effect for any deposited films including the HfO film and MgO film, i.e., a deposited film in the state shown in FIG. 2B, regardless of vertical arrangement of the HfO film and MgO film and mixed conditions of HfO and MgO.

Second Embodiment

Figure 6:
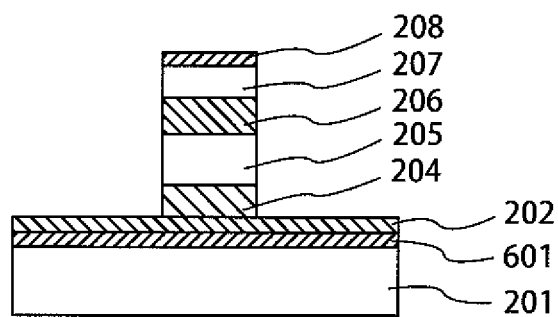
FIG. 6 is a cross-sectional view of a high-k/metal gate structure according to a second embodiment of the present invention.

With reference to FIG. 6, a method for processing a semiconductor device according to a second embodiment of the present invention will be described. FIG. 6 shows a multi-layered film, which has a deposited film including a $Y_2O_3$ film 601 under a HfO film 202, and is etched to the depth of a TiN film 204. The HfO film 202 has a thickness of 2 nm, while the $Y_2O_3$ film 601 has a thickness of 1 nm. In order to remove the HfO film 202 and $Y_2O_3$ film 601, the $Y_2O_3$ film 601 is first wet-etched in 1.4% $HNO_3$ solution for 120 seconds. Then, a dry etching process is performed mainly for the HfO film 202 with a mixed gas of $BCl_3$ of 80 ml/min and $Cl_2$ of 20 ml/min, in plasma at a pressure of 0.2 Pa, for 20 seconds with the wafer applied with a bias power of 10 W and subsequently for 60 seconds at a bias power of 0 W. Then, the $Y_2O_3$ film 601 is wet-etched in the 1.4% $HNO_3$ solution for 120 seconds. Furthermore, a dry etching process is performed mainly for the HfO film 202 with a mixed gas of $BCl_3$ of 80 ml/min and $Cl_2$ of 20 ml/min, in plasma at a pressure of 0.2 Pa, for 60 seconds at a bias power of 0 W. Through the above-described processes, the HfO film 202 and $Y_2O_3$ film 601 are removable. The reason why the removal of the $Y_2O_3$ film requires the wet and dry etching processes one more time than the removal of the MgO film in the first embodiment does is that the $Y_2O_3$ film has a high resistance to wet etching.

Removal of a deposited film that is thicker than that of the above example is possible by increasing the number of cycles of wet etching and dry etching (Steps S6 to S8 in FIG. 1). It is deemed that the mechanism of removing the films through the method of the second embodiment is the same as the mechanism of removing the MgO film in the first embodiment.

Third Embodiment

Next, a method for processing a semiconductor device according to a third embodiment of the present invention will be described. In the third embodiment, a deposited film having an $Al_2O_3$ film under a HfO film 202 is removed. In the case of the materials, the $Al_2O_3$ film is first wet-etched in HF solution (concentration: 0.25%, time: 120 seconds). Then, the HfO film 202 is dry-etched by a mixed gas of $BCl_3$ of 80 ml/min and $Cl_2$ of 20 ml/min, in plasma at a pressure of 0.2 Pa, for 20 seconds with the wafer applied with a bias power of 10 W and subsequently for 60 seconds at a bias power of 0 W. The deposited film can be removed through the processes. It is known that completely crystallized $Al_2O_3$ films are insoluble in acid; however, if the $Al_2O_3$ film is a thin film formed by CVD (chemical vapor deposition) as an insulating film or the like used in a semiconductor device, such a thin $Al_2O_3$ film can be removed by the HF solution. It is deemed that the mechanism of removing the films through the method of the third embodiment is the same as the mechanism of removing the MgO film in the first embodiment.

As described above, removal of a deposited film having a HfO film mixed with or placed on or under Mg, Y or Al is possible by alternately repeating the wet etching process and dry etching process. In addition, starting the removal procedure of the high-k dielectric film with the wet etching process can reduce the process time and damage in comparison to a procedure starting with dry etching. Even if a ZrO film is used instead of the HfO film, the deposited film including the ZrO film can be dry-etched by $BCl_3/Cl_2$ gas.

In the above-described embodiments, the conditions and the number of the wet etching processes and dry etching processes vary according to the thickness of the deposited film and therefore need to be optimized appropriately.

Fourth Embodiment

A method for processing a semiconductor device according to a fourth embodiment of the present invention will be described. This description explains the relationship of metal gate material, etching gas associated with the material and a high-k dielectric film in terms of removal. Although the metal gate is made of a TiN film in the above-described embodiments, the metal gate can be made of TaN, TaSiN, MoN, MoSiN and other various kinds of metal or nitride thereof. Gas used to etch the metal gate varies according to the material of the metal gate. For smooth removal of the high-k dielectric film, it is preferable to choose hard-to-deposit etching gases. Specifically, the appropriate gas to etch TiN, for the purpose of demonstrating the effect available by the method according to the embodiments of the present invention, is $CF_4$ gas for a breakthrough etching and $Cl_2$ gas or $Cl_2$ gas added with noble gas for the subsequent etching. The $Cl_2$ gas is also desirable to etch TaN. For materials, such as TaSiN, which contains a large amount of Si, the appropriate gas is $CF_4$, $SF_6$ or $NF_3$. In the case of MoN, it is preferable to use $Cl_2$ gas mixed with a miniscule amount of oxygen. If gases with a high deposition property, such as HBr and $CHF_3$ are added, a reaction product is deposited on a surface of the etched high-k dielectric film and may hinder the high-k dielectric film from being removed thereafter.

It should be understood by those skilled in the art that various modifications, combinations, sub-combinations and alterations may occur depending on design requirements and other factors insofar as they are within the scope of the appended claims or the equivalents thereof.

What is claimed is:

1. A method for processing a semiconductor device with a multi-layered film having a metal gate structure in which a metal electrode is placed on a deposited film formed on a Si substrate, the deposited film including a high-k dielectric film and a material for controlling a work function, the method comprising:
wet etching the deposited film including the high-k dielectric film and the material for controlling the work function, and,
subsequent to said wet etching, dry etching the deposited film which has been subjected to the wet etching.

2. The method for processing the semiconductor device according to claim 1, wherein the wet etching and the dry etching are alternately repeated until residues on a processed surface of the semiconductor device are removed.

3. The method for processing the semiconductor device according to claim 1, wherein the high-k dielectric film is made of Hf oxide or Zr oxide, and the material for controlling the work function is Mg, Y or Al.

4. The method for processing the semiconductor device according to claim 1, wherein the material for controlling the work function is formed into a film, and the film is deposited on or under the high-k dielectric film.

5. The method for processing the semiconductor device according to claim 1, wherein when the high-k dielectric film is made of Hf oxide or Zr oxide and the material for controlling the work function is Mg or Al, the wet etching process is performed with HF solution, and the dry etching process is performed with a mixed gas of $BCl_3$ and $Cl_2$.

6. The method for processing the semiconductor device according to claim 1, wherein when the high-k dielectric film is made of Hf oxide or Zr oxide and the material for controlling the work function is Y, the wet etching process is performed with $HNO_3$ solution and the dry etching process is performed with a mixed gas of $BCl_3$ and $Cl_2$.

7. The method for processing the semiconductor device according to claim 1, wherein the metal gate made of TiN or TaN is dry-etched by $Cl_2$ gas, and the metal gate made of TaSiN is dry-etched by $CF_4$, $SF_6$ or $NF_3$ gas.

8. The method for processing the semiconductor device according to claim 4, wherein the film of the material for controlling the work function is positioned under the high-k dielectric film.

9. A method for processing a semiconductor device with a multi-layered film having a metal gate structure, in which a metal electrode is positioned on a deposited film formed on a Si substrate, the deposited film including a high-k dielectric film and a material for controlling a work function, the method comprising, successively:
dry etching said metal electrode;
after said dry etching said metal electrode, wet etching said deposited film that includes the high-k dielectric film and the material for controlling the work function; and
after said wet etching, dry etching said deposited film that includes the high-k dielectric film and the material for controlling the work function, which has been subjected to said wet etching.

* * * * *